(12) United States Patent
Snow

(10) Patent No.: US 8,168,297 B2
(45) Date of Patent: *May 1, 2012

(54) FLUOROPOLYMER COATED FILM, PROCESS FOR FORMING THE SAME, AND FLUOROPOLYMER LIQUID COMPOSITION

(75) Inventor: Larry Glen Snow, Leroy, NY (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 599 days.

This patent is subject to a terminal disclaimer.

(21) Appl. No.: 12/101,413

(22) Filed: Apr. 11, 2008

(65) Prior Publication Data

US 2008/0261037 A1      Oct. 23, 2008

Related U.S. Application Data

(60) Provisional application No. 60/925,804, filed on Apr. 23, 2007.

(51) Int. Cl.
B32B 27/08      (2006.01)
C08K 5/02       (2006.01)

(52) U.S. Cl. ......... 428/421; 428/332; 526/250; 524/462

(58) Field of Classification Search ................... 428/421
See application file for complete search history.

(56) References Cited

U.S. PATENT DOCUMENTS

| | | | |
|---|---|---|---|
| 2,419,008 A | 4/1947 | Coffman et al. | |
| 2,510,783 A | 6/1950 | Johnston et al. | |
| 2,599,300 A | 6/1952 | Upson | |
| 3,087,827 A | 4/1963 | Klenke, Jr. et al. | |
| 3,087,828 A | 4/1963 | Linton | |
| 3,087,829 A | 4/1963 | Linton | |
| 3,133,854 A | 5/1964 | Simms | |
| 3,524,906 A | 8/1970 | Schmitt et al. | |
| 3,716,599 A | 2/1973 | Vasta | |
| 4,074,014 A | 2/1978 | Wollen | |
| 4,212,914 A * | 7/1980 | Ponomareva et al. | 442/117 |
| 4,273,829 A | 6/1981 | Perreault | |
| 4,314,004 A | 2/1982 | Stoneberg | |
| 4,323,554 A | 4/1982 | Bernhard | |
| 4,393,106 A | 7/1983 | Maruhashi et al. | |
| 4,416,925 A | 11/1983 | Goll | |
| 4,478,889 A | 10/1984 | Maruhashi et al. | |
| 4,522,866 A | 6/1985 | Nishikawa | |
| 4,557,977 A | 12/1985 | Memmer et al. | |
| 4,581,412 A | 4/1986 | Ohmori et al. | |
| 4,659,768 A | 4/1987 | Tortorello et al. | |
| 4,698,110 A | 10/1987 | Vassiliou | |
| 4,699,809 A | 10/1987 | Maruhashi et al. | |
| 4,743,492 A | 5/1988 | Wilson, II | |
| 4,786,546 A | 11/1988 | Vassiliou | |
| 4,923,718 A | 5/1990 | Iida et al. | |
| 4,931,324 A | 6/1990 | Ellison et al. | |
| 4,988,540 A | 1/1991 | Bragaw | |
| 5,139,878 A | 8/1992 | Kim et al. | |
| 5,169,915 A | 12/1992 | Mohri et al. | |
| 5,292,796 A | 3/1994 | Dams et al. | |
| 5,453,540 A | 9/1995 | Dams et al. | |
| 5,707,697 A | 1/1998 | Spain et al. | |
| 5,759,639 A | 6/1998 | Kloos | |
| 5,846,650 A | 12/1998 | Ko et al. | |
| 6,060,158 A | 5/2000 | Ono et al. | |
| 6,080,487 A | 6/2000 | Coggio et al. | |
| 6,242,547 B1 | 6/2001 | Uschold | |
| 6,383,620 B1 | 5/2002 | Aoyama et al. | |
| 6,403,740 B1 | 6/2002 | Uschold | |
| 6,632,518 B1 | 10/2003 | Schmidt et al. | |
| 6,833,414 B2 * | 12/2004 | Granel et al. | 525/479 |
| 7,270,870 B2 | 9/2007 | Hetzler et al. | |
| 7,553,540 B2 | 6/2009 | Debergalis et al. | |
| 8,025,928 B2 | 9/2011 | Snow | |
| 2002/0012801 A1 | 1/2002 | Oreins et al. | |
| 2003/0087103 A1 | 5/2003 | Belmares et al. | |
| 2004/0059033 A1 | 3/2004 | Toriumi | |
| 2004/0197568 A1 * | 10/2004 | Jing et al. | 428/421 |
| 2005/0158558 A1 | 7/2005 | Hayashida et al. | |
| 2006/0148350 A1 | 7/2006 | Chang et al. | |
| 2006/0148971 A1 | 7/2006 | Jing et al. | |

(Continued)

FOREIGN PATENT DOCUMENTS

CN      1 657 579      8/2005

(Continued)

OTHER PUBLICATIONS

Wypych, G. "Handbook of Fillers". ChemTec Publishing, 2000, 2nd ed. Ch. 2, pp. 15-177.*
DeBargalis, M. "Fluropolymer films in the photovoltaic industry". Journal of Fluorine Chemistry 125 (2004); pp. 1255-1257.*
Final Office Action, U.S. Appl. No. 11/642,071, Dated Nov. 19, 2009.
Office Action, U.S. Appl. No. 11/642,183, Oct. 1, 2008.
Office Action, U.S. Appl. No. 11/642,071, Jan. 8, 2009.
Notice of Allowance, U.S. Appl. No. 11/642,183, May 13, 2009.
Office Action, U.S. Appl. No. 12/492,372, Mar. 29, 2010.
Office Action, U.S. Appl. No. 12/492,375, Jul. 16, 2010.
Office Action, U.S. Appl. No. 11/642,071, Aug. 3, 2010.
Office Action, U.S. Appl. No. 12/492,372, Oct. 20, 2010.
Office Action, U.S. Appl. No. 12/797,920, Nov. 9, 2010.
Office Action, U.S. Appl. No. 11/642,071, Dec. 1, 2010.
Notice of Allowance, U.S. Appl. No. 12/492,372, Dec. 30, 2010.
Office Action, U.S. Appl. No. 12/492,375, Jan. 4, 2011.
Office Action, U.S. Appl. No. 12/969,865, Jan. 27, 2011.

(Continued)

Primary Examiner — David Sample
Assistant Examiner — Prashant J Khatri

(57) ABSTRACT

A process for forming a multilayer film includes coating a polymeric substrate film with a liquid fluoropolymer coating. The liquid fluoropolymer coating includes a fluoropolymer, solvent, a compatible cross-linkable adhesive polymer, and a cross-linking agent. The process further includes cross-linking the compatible cross-linkable adhesive polymer to form a cross-linked polymer network in the fluoropolymer coating, removing the solvent from the fluoropolymer coating, and adhering the fluoropolymer coating to the polymeric substrate film. A liquid fluoropolymer coating composition includes a fluoropolymer selected from homopolymers and copolymers of vinyl fluoride and homopolymers and copolymers of vinylidene fluoride, solvent, a compatible cross-linkable adhesive polymer, and a cross-linking agent. A fluoropolymer coated film includes a polymeric substrate film and a fluoropolymer coating on the polymeric substrate film. The fluoropolymer coating includes a fluoropolymer and a compatible cross-linked adhesive polymer.

13 Claims, No Drawings

U.S. PATENT DOCUMENTS

| | | |
|---|---|---|
| 2006/0199029 A1 | 9/2006 | Liu et al. |
| 2006/0234038 A1 | 10/2006 | Kernander et al. |
| 2006/0280922 A1 | 12/2006 | Hull et al. |
| 2007/0154704 A1 | 7/2007 | Debergalis et al. |
| 2007/0166469 A1 | 7/2007 | Snow et al. |
| 2012/0024352 A1 | 2/2012 | De Bergalis et al. |

FOREIGN PATENT DOCUMENTS

| | | |
|---|---|---|
| EP | 0 467 570 A2 | 1/1992 |
| FR | 2 654 736 | 5/1991 |
| GB | 1 395 432 | 5/1975 |
| JP | 57-037711 | 3/1982 |
| JP | 2-151608 | 6/1990 |
| JP | 2-170855 | 7/1990 |
| JP | 3-212411 | 9/1991 |
| JP | 3-294347 | 12/1991 |
| JP | 6-211945 | 8/1994 |
| JP | 10-138264 | 5/1998 |
| JP | 10256580 A | 9/1998 |
| JP | 11-309830 | 11/1999 |
| JP | 2000-301053 | 10/2000 |
| JP | 2006-031951 A | 2/2006 |
| JP | 2006-169328 | 6/2006 |
| WO | WO97/49777 | 12/1997 |
| WO | 2006/086081 A1 | 8/2006 |
| WO | WO 2007/009140 A1 | 1/2007 |

OTHER PUBLICATIONS

Office Action, U.S. Appl. No. 12/797,920, Mar. 15, 2011.
Notice of Allowance, U.S. Appl. No. 12/797,920, Jun. 1, 2011.
Notice of Allowance, U.S. Appl. No. 11/642,071, Apr. 27, 2011.
Notice of Allowance mailed Jul. 8, 2011, in co-pending U.S. Appl. No. 12/492,372.
Notice of Allowance mailed Jul. 7, 2011, in co-pending U.S. Appl. No. 12/492,375.
Non-Final Office Action, U.S. Appl. No. 12/970,209, filed Dec. 16, 2010, First Named Inventor: Larry Glen Snow, Conf. No. 5682, Dec. 28, 2011.
Non-Final Office Action, U.S. Appl. No. 13/245,033, filed Sep. 26, 2011, First Named Inventor: Michael De Bergalis, Conf. No. 2596, Nov. 21, 2011.

* cited by examiner

FLUOROPOLYMER COATED FILM, PROCESS FOR FORMING THE SAME, AND FLUOROPOLYMER LIQUID COMPOSITION

BACKGROUND INFORMATION

1. Field of the Disclosure

This disclosure relates to a fluoropolymer coated film, a process for forming a fluoropolymer coated film, and a fluoropolymer liquid composition.

2. Description of the Related Art

Photovoltaic (PV) cells are used to produce electrical energy from sunlight, offering a more environmentally friendly alternative to traditional methods of electricity generation. These solar cells are built from various semiconductor systems which must be protected from environmental effects such as moisture, oxygen, and UV light. The cells are usually jacketed on both sides by encapsulating layers of glass and/or plastic films forming a multilayer structure known as a photovoltaic module. Fluoropolymer films are recognized as an important component in photovoltaic modules due to their excellent strength, weather resistance, UV resistance, and moisture barrier properties. Especially useful in these modules are film composites of fluoropolymer film and polymeric substrate film which act as a backing sheet for the module. Such composites have traditionally been produced from preformed films of fluoropolymer, specifically polyvinyl fluoride (PVF), adhered to polyester substrate film, specifically polyethylene terephthalate. When fluoropolymer such as PVF is used as a backsheet for the PV module, its properties significantly improve the module life, enabling module warranties of up to 25 years. Fluoropolymer backsheets are frequently employed in the form of a laminate with polyethylene terephthalate (PET) films, typically with the PET sandwiched between two PVF films.

However, laminates of preformed fluoropolymer films on polymeric substrates having a bond which will not delaminate after years of outdoor exposure are difficult to make. Prior art systems such as U.S. Pat. No. 3,133,854 to Simms, U.S. Pat. No. 5,139,878 to Kim, et al., and No. U.S. Pat. No. 6,632,518 to Schmidt, et al. describe primers and adhesives for preformed films that will produce durable laminate structures. However, these processes require the application of at least one adhesive layer, or both a primer and an adhesive layer, prior to the actual lamination step. The lamination step then requires the application of heat and pressure to form the laminate. Therefore, prior art laminates using preformed fluoropolymer films are expensive to manufacture and/or require capital intensive equipment. Because preformed fluoropolymer films must have sufficient thickness to provide strength for handling during manufacture and subsequent processing, the resulting laminates may also incorporate thick layers of fluoropolymer, i.e., thicker than are necessary for an effective protective layer.

SUMMARY

The invention provides a fluoropolymer coated polymeric substrate film with fewer overall processing steps than manufacturing laminates with preformed fluoropolymer films, while also providing strong adhesion to the substrate and good durability of the fluoropolymer coated film. In addition, providing the fluoropolymer in the form of a coating enables thinner, more cost effective, fluoropolymer coating layers. Employing fluoropolymer coatings also enables the incorporation of additives into the fluoropolymer layer tailored to the intended use of the fluoropolymer coated film, e.g., fillers which can improve barrier properties.

A process for forming a multilayer film includes coating a polymeric substrate film with a liquid fluoropolymer coating. The liquid fluoropolymer coating includes a fluoropolymer selected from homopolymers and copolymers of vinyl fluoride and homopolymers and copolymers of vinylidene fluoride, solvent, a compatible cross-linkable adhesive polymer, and a cross-linking agent. The process further includes cross-linking the compatible cross-linkable adhesive polymer to form a cross-linked polymer network in the fluoropolymer coating, removing the solvent from the fluoropolymer coating, and adhering the fluoropolymer coating to the polymeric substrate film.

A liquid fluoropolymer coating composition includes a fluoropolymer selected from homopolymers and copolymers of vinyl fluoride and homopolymers and copolymers of vinylidene fluoride, solvent, a compatible cross-linkable adhesive polymer, and a cross-linking agent.

A fluoropolymer coated film includes a polymeric substrate film and a fluoropolymer coating on the polymeric substrate film. The fluoropolymer coating includes a fluoropolymer selected from homopolymers and copolymers of vinyl fluoride and homopolymers and copolymers of vinylidene fluoride and a compatible cross-linked adhesive polymer. The compatible cross-linked adhesive polymer includes functional groups selected from carboxylic acid, sulfonic acid, aziridine, anhydride, amine, isocyanate, melamine, epoxy, hydroxyl, and combinations thereof. The polymeric substrate film includes functional groups that interact with the compatible cross-linked adhesive polymer to promote bonding of the Fluoropolymer coating to the polymeric substrate film.

The foregoing general description and the following detailed description are exemplary and explanatory only and are not restrictive of the invention, as defined in the appended claims.

DETAILED DESCRIPTION

In a first aspect, a process for forming a multilayer film includes coating a polymeric substrate film with a liquid fluoropolymer coating. The liquid fluoropolymer coating includes a fluoropolymer selected from homopolymers and copolymers of vinyl fluoride and homopolymers and copolymers of vinylidene fluoride, solvent, a compatible cross-linkable adhesive polymer, and a cross-linking agent. The process further includes cross-linking the compatible cross-linkable adhesive polymer to form a cross-linked polymer network in the fluoropolymer coating, removing the solvent from the fluoropolymer coating, and adhering the fluoropolymer coating to the polymeric substrate film.

In one embodiment of the first aspect, cross-linking, removing, and adhering are performed by heating. In a more specific embodiment, the fluoropolymer is in the form of particles in a dispersion, and heating further includes coalescing the fluoropolymer. In another more specific embodiment, heating is a single heating. In a still more specific embodiment, heating includes heating to a temperature in a range of about 150° C. to 250° C.

In another embodiment of the first aspect, the compatible cross-linkable adhesive polymer is selected from polyesters, polycarbonates, acrylics, polyethers, ethylene vinyl alcohol copolymers, amides, acrylamides, urethanes and combinations thereof. In a more specific embodiment, the compatible cross-linkable adhesive polymer is selected from polyester polyols, polycarbonate polyols, acrylic polyols, polyether polyols, ethylene vinyl alcohol copolymers, and combinations thereof.

In still another embodiment of the first aspect, cross-linking the compatible cross-linkable adhesive polymer includes forming a polyurethane network. In yet another embodiment of the first aspect, the cross-linking agent includes an isocyanate functional compound or a blocked isocyanate functional compound.

In still yet another embodiment of the first aspect, adhering includes forming bonds between functional groups of the polymeric substrate film and the compatible cross-linkable adhesive polymer, the cross-linking agent, or a combination thereof.

In a further embodiment of the first aspect, the process further includes modifying the polymeric substrate film prior to coating to provide additional functional groups capable of forming bonds with the compatible cross-linkable adhesive polymer, the cross-linking agent, or a combination thereof. In a more specific embodiment, modifying includes using a surface activation process.

In still a further embodiment of the first aspect, coating comprises coating both surfaces of the polymeric substrate film with the fluoropolymer coating.

In a second aspect, a liquid fluoropolymer coating composition includes a fluoropolymer selected from homopolymers and copolymers of vinyl fluoride and homopolymers and copolymers of vinylidene fluoride, solvent, a compatible cross-linkable adhesive polymer, and a cross-linking agent.

In one embodiment of the second aspect, the compatible cross-linkable adhesive polymer includes functional groups selected from carboxylic acid, sulfonic acid, aziridine, anhydride, amine, isocyanate, melamine, epoxy, hydroxyl, and combinations thereof. In another embodiment of the second aspect, the cross-linking agent includes functional groups selected from carboxylic acid, sulfonic acid, aziridine, anhydride, amine, isocyanate, melamine, epoxy, hydroxyl, and combinations thereof.

In still another embodiment of the second aspect, the cross-linking agent includes an isocyanate functional compound or a blocked isocyanate functional compound. In still yet another embodiment of the second aspect, the fluoropolymer is selected from homopolymers and copolymers of vinyl fluoride comprising at least 60 mole % vinyl fluoride and homopolymers and copolymers of vinylidene fluoride comprising at least 60 mole % vinylidene fluoride.

In a further embodiment of the second aspect, the fluoropolymer coating includes about 1 to about 40 weight % of the compatible cross-linkable adhesive polymer based on fluoropolymer solids content. In still a further embodiment of the second aspect, the fluoropolymer coating further includes pigment. In a specific embodiment, the fluoropolymer coating includes about 1 to about 35 weight % of pigment based on fluoropolymer solids content.

In yet a further embodiment of the second aspect, the fluoropolymer is in the form of dispersion particles in the solvent and the solvent includes dimethylacetamide, propylene carbonate, butyrolactone, N-methylpyrrolidone, dimethylsulfoxide, or a combination thereof.

In a third aspect, a fluoropolymer coated film includes a polymeric substrate film and a fluoropolymer coating on the polymeric substrate film. The fluoropolymer coating includes a fluoropolymer selected from homopolymers and copolymers of vinyl fluoride and homopolymers and copolymers of vinylidene fluoride and a compatible cross-linked adhesive polymer. The compatible cross-linked adhesive polymer includes functional groups selected from carboxylic acid, sulfonic acid, aziridine, anhydride, amine, isocyanate, melamine, epoxy, hydroxyl, and combinations thereof. The polymeric substrate film includes functional groups that interact with the compatible cross-linked adhesive polymer to promote bonding of the fluoropolymer coating to the polymeric substrate film.

In one embodiment of the third aspect, the compatible cross-linked adhesive polymer is selected from polyesters, polyester urethanes, polycarbonates, polycarbonate urethanes, acrylics, acrylic polyurethanes, polyethers, polyether urethanes, ethylene vinyl alcohol copolymers, ethylene vinyl alcohol copolymer urethanes, polyamides, polyamide urethanes, polyamide ureas, polyacrylamides, polyacrylamide urethanes and combinations thereof. In another embodiment of the third aspect, the fluoropolymer coating includes interpenetrating networks of fluoropolymer and compatible cross-linked adhesive polymer.

In still another embodiment of the third aspect, the fluoropolymer is selected from homopolymers and copolymers of vinyl fluoride comprising at least 60 mole % vinyl fluoride and homopolymers and copolymers of vinylidene fluoride comprising at least 60 mole % vinylidene fluoride. In still yet another embodiment of the third aspect, the fluoropolymer coating includes about 1 to about 40 weight % of the compatible cross-linked adhesive polymer based on fluoropolymer solids content.

In a further embodiment of the third aspect, the fluoropolymer coating further includes pigment. In a specific embodiment, the fluoropolymer coating comprises about 1 to about 35 weight % of pigment based on fluoropolymer solids content.

In still a further embodiment of the third aspect, the fluoropolymer coating is on both sides of the polymeric substrate film. In still yet a further embodiment of the third aspect, the polymeric substrate film includes polyester, polyamide, polyimide, or any combination thereof. In a specific embodiment, the polyester is selected from polyethylene terephthalate, polyethylene naphthalate, and combinations thereof.

In yet another embodiment of the third aspect, the fluoropolymer coating has a thickness of about 0.1 to about 10.0 mils. In yet a further embodiment of the third aspect, the polymeric substrate film has a thickness of about 0.5 to about 10 mils.

In still another embodiment of the third aspect, the polymeric substrate film further includes filler. In still another further embodiment of the third aspect, a backsheet for a photovoltaic module includes the fluoropolymer coated film.

Many aspects and embodiments have been described above and are merely exemplary and not limiting. After reading this specification, skilled artisans appreciate that other aspects and embodiments are possible without departing from the scope of the invention. Other features and advantages of the invention will be apparent from the following detailed description, and from the claims.

Fluoropolymers

Fluoropolymers useful in the fluoropolymer coated film in accordance with one aspect of the invention are selected from homopolymers and copolymers of vinyl fluoride (VF) and homopolymers and copolymers of vinylidene fluoride (VF2). In one embodiment, the fluoropolymer is selected from homopolymers and copolymers of vinyl fluoride comprising at least 60 mole % vinyl fluoride and homopolymers and copolymers of vinylidene fluoride comprising at least 60 mole % vinylidene fluoride. In a more specific embodiment, the fluoropolymer is selected from homopolymers and copolymers of vinyl fluoride comprising at least 80 mole % vinyl fluoride and homopolymers and copolymers of vinylidene fluoride comprising at least 80 mole % vinylidene fluoride. Blends of the fluoropolymers with nonfluoropolymers, e.g., acrylic polymers, may also be suitable for the practice of some aspects of the invention. Homopolymer polyvinyl fluoride (PVF) and homopolymer polyvinylidene fluoride (PVDF) are well suited for the practice of specific aspects of the invention. Fluoropolymers selected from homopolymer polyvinyl fluoride and copolymers of vinyl fluoride are particularly effective for the practice of the present invention.

In one embodiment, with VF copolymers or VF2 copolymers, comonomers can be either fluorinated or nonfluorinated or combinations thereof. By the term "copolymers" is meant copolymers of VF or VF2 with any number of additional fluorinated monomer units so as to form dipolymers, terpolymers, tetrapolymers, etc. If nonfluorinated monomers are used, the amount used should be limited so that the copolymer retains the desirable properties of the fluoropolymer, i.e., weather resistance, solvent resistance, barrier properties, etc. In one embodiment, fluorinated comonomers are used including fluoroolefins, fluorinated vinyl ethers, or fluorinated dioxoles. Examples of useful fluorinated comonomers include tetrafluoroethylene (TFE), hexafluoropropylene (HFP), chlorotrifluoroethylene (CTFE), trifluoroethylene, hexafluoroisobutylene, perfluorobutyl ethylene, perfluoro (propyl vinyl ether) (PPVE), perfluoro (ethyl vinyl ether) (PEVE), perfluoro (methyl vinyl ether) (PMVE), perfluoro-2,2-dimethyl-1,3-dioxole (PDD) and perfluoro-2-methylene-4-methyl-1,3-dioxolane (PMD) among many others.

Homopolymer PVDF coatings can be formed from a high molecular weight PVDF. Blends of PVDF and alkyl (meth) acrylate polymers can be used. Polymethyl methacrylate is particularly desirable. Typically, these blends can comprise 50-70% by weight of PVDF and 30-50% by weight of alkyl (meth)acrylate polymers, in a specific embodiment, polymethyl methacrylate. Such blends may contain compatibilizers and other additives to stabilize the blend. Such blends of polyvinylidene fluoride, or vinylidene fluoride copolymer, and acrylic resin as the principal components are described in U.S. Pat. Nos. 3,524,906; 4,931,324; and 5,707,697.

Homopolymer PVF coatings can be formed from a high molecular weight PVF. Suitable VF copolymers are taught by U.S. Pat. Nos. 6,242,547 and 6,403,740 to Uschold.

Compatible Cross-Linkable Adhesive Polymers and Cross-Linking Agents

The compatible cross-linkable adhesive polymers employed in the fluoropolymer coated film according to one aspect of the invention comprise functional groups selected from carboxylic acid, sulfonic acid, aziridine, amine, isocyanate, melamine, epoxy, hydroxyl, anhydride and combinations thereof. In one embodiment, the compatible cross-linkable adhesive polymer has (1) a backbone composition that is compatible with the fluoropolymer in the composition and (2) pendant functionality capable of reacting with complementary functional groups on a substrate film surface. The compatibility of the cross-linkable adhesive polymer backbone with the fluoropolymer will vary but is sufficient so that the compatible cross-linkable adhesive polymer can be introduced into the fluoropolymer in the desired amount to secure the fluoropolymer coating to the polymeric substrate film. In general however, homo and copolymers derived largely from vinyl fluoride and vinylidene fluoride will show compatibility characteristics that will favor acrylic, urethane, aliphatic polyester, polyester urethane, polyether, ethylene vinyl alcohol copolymer, amide, acrylamide, urea and polycarbonate backbones having the functional groups described above.

The free radical addition polymers derived from acrylic and acrylamide monomers are well suited to the introduction of pendant functional groups using the wealth of functional monomers available. Some representatives include glycidyl acrylate and methacrylate for the introduction of epoxy groups. These can then be converted into reactive aminoalcohol groups by reaction of the epoxy functional acrylic with ammonia or primary alkylamines. Carboxylic acid, isocyanate, hydroxyl and anhydride functionalities are all available using acrylic/methacrylic acid, isocyanatoethyl methacrylate, hydroxyethyl methacrylate or maleic anhydride respectively. Numerous other functional monomers are available for functional group introduction as is well known in the art.

In a specific embodiment, where the polymeric substrate film is an unmodified polyester with intrinsic hydroxyl and carboxylic acid functional groups, reactive polyols (e.g., polyester polyols, polycarbonate polyols, acrylic polyols, polyether polyols, etc.) can be used as the compatible cross-linkable adhesive polymer in the presence of an appropriate cross-linking agent (e.g., an isocyanate functional compound or a blocked isocyanate functional compound) to bond the fluoropolymer coating to the polymeric substrate film. The bonding may occur through the functional groups of the reactive polyols, the cross-linking agent, or both. Upon curing, a cross-linked polyurethane network is formed as an interpenetrating network with the fluoropolymer in the coating. In addition, it is believed that the cross-linked polyurethane network also provides the functionality that bonds the fluoropolymer coating to the polyester substrate film.

Those skilled in the art will understand that choices for compatible cross-linkable adhesive polymers and cross-linking agents can be based on compatibility with the fluoropolymer, compatibility with the selected fluoropolymer solution or dispersion, their compatibility with the processing conditions for forming the fluoropolymer coating on the selected polymeric substrate film, their ability to form cross-linked networks during formation of the fluoropolymer coating, and/or the compatibility of their functional groups with those of the polymeric substrate film in forming bonds that provide strong adherence between the fluoropolymer coating and the polymeric substrate film.

Numerous cross-linking agents and compatible cross-linkable adhesive polymer combinations are possible. Examples include amine functional cross-linking agents with epoxy, anhydride or carboxylic acid compatible cross-linkable adhesive polymers, epoxy functional cross-linking agents with carboxylic acid or amine functional compatible cross-linkable adhesive polymers, aziridine functional cross-linking agents with carboxylic acid, or amine functional compatible cross-linkable adhesive polymers, and melamine cross-linking agents with hydroxyl functional compatible cross-linkable adhesive polymers. Those skilled in the art will be able to select a compatible adhesive polymer and cross-linking agent based on the properties of the polymer systems being used in the process and the desired properties of the final multilayer film.

Pigments and Fillers

If desired, various color, opacity and/or other property effects can be achieved by incorporating pigments and fillers into the fluoropolymer coating composition dispersion during manufacture. In one embodiment, pigments are used in amounts of about 1 to about 35 wt % based on fluoropolymer solids. Typical pigments that can be used include both clear pigments, such as inorganic siliceous pigments (silica pigments, for example) and conventional pigments. Conventional pigments that can be used include metallic oxides such as titanium dioxide, and iron oxide; metal hydroxides; metal flakes, such as aluminum flake; chromates, such as lead chromate; sulfides; sulfates; carbonates; carbon black; silica; talc; china clay; phthalocyanine blues and greens, organo reds; organo maroons and other organic pigments and dyes. In one embodiment, the type and amount of pigment is selected to prevent any significant adverse affects on the desirable properties of fluoropolymer coating, e.g., weatherability, as well as being selected for stability at elevated processing temperature may be used during film formation.

Pigments can be formulated into a millbase by mixing the pigments with a dispersing resin that may be the same as or compatible with the fluoropolymer composition into which the pigment is to be incorporated. Pigment dispersions can be formed by conventional means, such as sand grinding, ball milling, attritor grinding or two-roll milling. Other additives, while not generally needed or used, such as fiber glass and mineral fillers, anti-slip agents, plasticizers, nucleating agents, and the like, can be incorporated.

UV Additives and Thermal Stabilizers

The fluoropolymer coating compositions may contain one or more light stabilizers as additives. Light stabilizer additives include compounds that absorb ultraviolet radiation such as hydroxybenzophenones and hydroxybenzotriazoles. Other possible light stabilizer additives include hindered amine light stabilizers (HALS) and antioxidants. Thermal stabilizers can also be used if desired.

Barrier Particles

In one embodiment, the fluoropolymer coating composition includes barrier particles. In a specific embodiment, the particles are platelet-shaped particles. Such particles tend to align during application of the coating and, since water, solvent and gases such as oxygen cannot pass readily through the particles themselves, a mechanical barrier is formed in the resulting coating which reduces permeation of water, solvent and gases. In a photovoltaic module, for example, the barrier particles substantially increase the moisture barrier properties of the fluoropolymer and enhance the protection provided to the solar cells. In some embodiments, barrier particles are present in the amount of about 0.5 to about 10% by weight based on the total dry weight of the fluoropolymer composition in the coating.

Examples of typical platelet shaped filler particles include mica, glass flake and stainless steel flake, and aluminum flake. In one embodiment, the platelet shaped particles are mica particles, including mica particles coated with an oxide layer such as iron or titanium oxide. In some embodiments, these particles have an average particle size of about 10 to 200 μm, in more specific embodiments 20 to 100 μm, with no more than 50% of the particles of flake having average particle size of more than about 300 μm. The mica particles coated with an oxide layer are described in U.S. Pat. No. 3,087,827 (Klerike and Stratton); U.S. Pat. No. 3,087,828 (Linton); and U.S. Pat. No. 3,087,829 (Linton). The micas described in these patents are coated with oxides or hydrous oxides of titanium, zirconium, aluminum, zinc, antimony, tin, iron, copper, nickel, cobalt, chromium, or vanadium. Mixtures of coated micas can also be used.

Fluoropolymer Liquid Coating Composition Formulation

The fluoropolymer liquid coating compositions may contain the fluoropolymer either in the form of a solution or dispersion of the fluoropolymer. Typical solutions or dispersions for the fluoropolymer are prepared using solvents which have boiling points high enough to avoid bubble formation during the film forming/drying process. For polymers in dispersion form, a solvent which aids in coalescence of the fluoropolymer is desirable. The polymer concentration in these solutions or dispersions is adjusted to achieve a workable viscosity of the solution and will vary with the particular polymer, the other components of the composition, and the process equipment and conditions used. In one embodiment, for solutions the fluoropolymer is present in an amount of about 10 wt % to about 25 wt % based on the total weight of the composition. In another embodiment, for dispersions, the fluoropolymer is present in an amount of about 25 wt % to about 50 wt % based on the total weight of the liquid composition.

The form of the polymer in the liquid coating composition is dependent upon the type of fluoropolymer and the solvent used. Homopolymer PVF is normally in dispersion form. Homopolymer PVDF can be in dispersion or solution form dependent upon the solvent selected. For example, homopolymer PVDF can form stable solutions at room temperature in many polar organic solvents such as ketones, esters and some ethers. Suitable examples include acetone, methylethyl ketone (MEK) and tetrahydrofuran (THF). Depending upon comonomer content and the solvent selected, copolymers of VF and VF2 may be used either in dispersion or solution form.

In one embodiment using homopolymer polyvinyl fluoride (PVF), suitable coating formulations are prepared using dispersions of the fluoropolymer. The nature and preparation of dispersions are described in detail in U.S. Pat. Nos. 2,419,008; 2,510,783; and 2,599,300. In a specific embodiment, PVF dispersions are formed in dimethyl acetamide, propylene carbonate, γ-butyrolactone, N-methylpyrrolidone, or dimethylsulfoxide.

To prepare the fluoropolymer liquid coating composition in dispersion form, the fluoropolymer and the compatible cross-linkable adhesive polymer, the cross-linking agent, and, optionally one or more dispersants and/or pigments, are generally first milled together in a suitable solvent. Alternatively, the various components are milled or appropriately mixed separately. Components which are soluble in the solvent do not require milling.

A wide variety of mills can be used for the preparation of the dispersion. Typically, the mill employs a dense agitated grinding medium, such as sand, steel shot, glass beads, ceramic shot, Zirconia, or pebbles, as in a ball mill, an ATTRITOR® available from Union Process, Akron, Ohio, or an agitated media mill such as a "Netzsch" mill available from Netzsch, Inc., Exton, Pa. The dispersion is milled for a time sufficient to cause deagglomeration of the PVF. Typical residence time of the dispersion in a Netzsch mill ranges from thirty seconds up to ten minutes.

The compatible cross-linkable adhesive polymer is employed in the liquid coating composition at a level sufficient to provide the desired bonding to the polymeric substrate film but below the level at which the desirable properties of the fluoropolymer would be significantly adversely affected. In one embodiment, the liquid coating composition contains about 1 to about 40 wt % compatible cross-linkable adhesive polymer, in more specific embodiments, about 1 to about 25 wt % compatible cross-linkable adhesive polymer, and in still more specific embodiments 1 to about 20 wt % compatible cross-linkable adhesive polymer, based on the weight of the fluoropolymer.

The cross-linking agent is employed in the liquid coating composition at a level sufficient to provide the desired cross-linking of the compatible cross-linkable adhesive polymer. In one embodiment, the liquid coating composition contains about 50 to about 400 mole % cross-linking agent per molar equivalent of cross-linkable adhesive polymer. In a more specific embodiment, the liquid coating composition contains about 75 to about 150 mole % cross-linking agent per molar equivalent of cross-linkable adhesive polymer. In another more specific embodiment, the liquid coating composition contains about 90 to about 125 mole % cross-linking agent per molar equivalent of cross-linkable adhesive polymer.

Polymeric Substrate Films

Polymeric substrate films used in this invention may be selected from a wide number of polymers, with thermoplastics being desirable for their ability to withstand higher processing temperatures. The polymeric substrate film comprises functional groups on its surface that interact with the compatible cross-linkable adhesive polymer, the cross-linking agent, or both, to promote bonding of the fluoropolymer coating to the substrate film. In one embodiment, the polymeric substrate film is a polyester, a polyamide or a polyimide. In a specific embodiment, a polyester for the polymeric substrate film is selected from polyethylene terephthalate, polyethylene naphthalate and a coextrudate of polyethylene terephthalate/polyethylene naphthalate.

Fillers may also be included in the substrate film, where their presence may improve the physical properties of the substrate, for example, higher modulus and tensile strength. They may also improve adhesion of the fluoropolymer to the substrate film. One exemplary filler is barium sulfate, although others may also be used.

The surface of the polymeric substrate film which is to be coated may naturally possess functional groups suitable for bonding as in hydroxyl and/or carboxylic acid groups in a polyester film or amine and/or acid functionality in a polyamide film. The presence of these intrinsic functional groups on the surface of a polymeric substrate film clearly provide commercial benefits by simplifying the process of bonding a coating onto the polymeric substrate film to form a multilayer film. The invention employs compatible cross-linkable adhesive polymers and/or cross-linking agents in the coating composition that may take advantage of the intrinsic functionality of the polymeric substrate film. In this way, an unmodified polymeric substrate film can be chemically bonded to a fluoropolymer coating (i.e., without the use of separate primer layers or adhesives or separate surface activation treatments) to form a multilayer film with excellent adhesion. The term "unmodified polymeric substrate film" as used in this application means polymeric substrates which do not include primer layers or adhesives and which do not include surface treatment or surface activation such as are described in the following paragraph. In addition, an unprimed polymeric substrate film can be chemically bonded to a fluoropolymer coating to form a multilayer film with excellent adhesion. The term "unprimed polymeric substrate film" as used in this application means polymeric substrates which do not include primer layers but may include surface treatment or surface activation such as are described in the following paragraph.

Many polymeric substrate films may need or would further benefit from modifying to provide additional functional groups suitable for bonding to the fluoropolymer coating, however, and this may be achieved by surface treatment, or surface activation. That is, the surface can be made more active by forming functional groups of carboxylic acid, sulfonic acid, aziridine, amine, isocyanate, melamine, epoxy, hydroxyl, anhydride and/or combinations thereof on the surface. In one embodiment, the surface activation can be achieved by chemical exposure, such as to a gaseous Lewis acid such as $BF_3$ or to sulfuric acid or to hot sodium hydroxide. Alternatively, the surface can be activated by exposing one or both surfaces to an open flame while cooling the opposite surface. Surface activation can also be achieved by subjecting the film to a high frequency, spark discharge such as corona treatment or atmospheric nitrogen plasma treatment. Additionally, surface activation can be achieved by incorporating compatible comonomers into the polymeric substrate when forming a film. Those skilled in the art, will appreciate the wide variety of processes that may be used to form compatible functional groups on the surface of a polymeric substrate film.

In addition, modifying to provide additional functional groups suitable for bonding to the fluoropolymer coating may be performed by applying a primer layer to the surface of the polymeric substrate film to increase its surface functionality, as described in U.S. Patent Application Publication No. US 2007/0154704 A1, "FLUOROPOLYMER COATED FILMS USEFUL FOR PHOTOVOLTAIC MODULES", DeBergalis et al., published Jul. 5, 2007, which is incorporated herein by reference in its entirety.

Coating Application

The fluoropolymer compositions for making the fluoropolymer coated film in accordance with one aspect of the present invention can be applied as a liquid directly to suitable polymeric substrate films by conventional coating means with no need to form a preformed film. Techniques for producing such coatings include conventional methods of casting, dipping, spraying and painting. When the fluoropolymer coating contains fluoropolymer in dispersion form, it is typically applied by casting the dispersion onto the substrate film, using conventional means, such as spray, roll, knife, curtain, gravure coaters, or any other method that permits the application of a uniform coating without streaks or other defects. In one embodiment, the dry coating thickness of a cast dispersion is between about 2.5 μm (0.1 mil) and about 250 μm (10 mils), in a more specific embodiment between about 13 μm (0.5 mil) to about 130 μm (5 mils).

After application, the compatible cross-linkable adhesive polymer is cross-linked, the solvent is removed, and the fluoropolymer coating is adhered to the polymeric substrate film. With some compositions in which the fluoropolymer is in solution form, the liquid fluoropolymer coating compositions can be coated onto polymeric substrate films and allowed to air dry at ambient temperatures. Although not necessary to produce a coalesced film, heating is generally desirable to cross-link the compatible cross-linkable adhesive polymer and to dry the fluoropolymer coating more quickly. Cross-linking the compatible cross-linkable adhesive polymer, removing of the solvent, and adhering of the fluoropolymer coating to the polymeric substrate can be achieved in a single heating or by multiple heatings. Drying temperature are in the range of about 25° C. (ambient conditions) to about 200° C. (oven temperature—the film temperature will be lower). The temperature used should also be sufficient to promote the interaction of the functional groups in the compatible cross-linkable adhesive polymer and/or cross-linking agent with the functional groups of the polymeric substrate film to provide secure bonding of the fluoropolymer coating to the polymeric substrate film. This temperature varies widely with the compatible cross-linkable adhesive polymer and cross-linking agent employed and the functional groups of substrate film. The drying temperature can range from room temperature to oven temperatures in excess of that required for the coalescence of fluoropolymers in dispersion form as discussed below.

When the fluoropolymer in the composition is in dispersion form, it is necessary for the solvent to be removed, for cross-linking of the compatible adhesive polymer to occur, and also for the fluoropolymer to be heated to a sufficiently high temperature that the fluoropolymer particles coalesce into a continuous film. In addition, bonding to the polymeric substrate film is desired. In one embodiment, fluoropolymer in the coating is heated to a temperature of about 150° C. to about 250° C. The solvent used desirably aids in coalescence, i.e., enables a lower temperature to be used for coalescence of the fluoropolymer coating than would be necessary with no solvent present. Thus, the conditions used to coalesce the fluoropolymer will vary with the fluoropolymer used, the thickness of the cast dispersion and the substrate film, and other operating conditions. For homopolymer PVF coatings and residence times of about 1 to about 3 minutes, oven temperatures of about from 340° F. (171° C.) to about 480° F. (249° C.) can be used to coalesce the film, and temperatures of about 380° F. (193° C.) to about 450° F. (232° C.) have been found to be particularly satisfactory. The oven air temperatures, of course, are not representative of the temperatures reached by the fluoropolymer coating which will be lower.

Formation of a cross-linked network of compatible adhesive polymer in the presence of the coalescing fluoropolymer can result in the formation of interpenetrating networks of compatible cross-linkable adhesive polymer and fluoropolymer, creating an interlocked network. Thus, even if there is segregation or phase separation of the two polymer networks within the fluoropolymer coating and an absence of chemical bonding between the two networks, a strong durable coating is still formed. As long as there is adequate bonding between the compatible cross-linked adhesive polymer and the polymeric substrate film, excellent adhesion between the layers of the multilayer film can be attained.

The fluoropolymer coating composition is applied to a polymeric substrate film. In one embodiment, the polymeric substrate film is polyester, polyamide, or polyimide. In a specific embodiment, the polymeric substrate film is polyester such as polyethylene terephthalate, polyethylene napthalate or a coextrudate of polyethylene terephthalate/polyethylene naphthalate. In another embodiment, the fluoropolymer coating is applied to both surfaces of the substrate film. This can be performed simultaneously on both sides of the polymeric substrate film or alternatively, the coated substrate film can be dried, turned to the uncoated side and resubmitted to the same coating head to apply coating to the opposite side of the film to achieve coating on both sides of the film.

Photovoltaic Modules

Fluoropolymer coated films are especially useful in photovoltaic modules. A typical construction for a photovoltaic module includes a thick layer of glass as a glazing material. The glass protects solar cells comprising crystalline silicon wafers and wires which are embedded in a moisture resisting plastic sealing compound such as cross-linked ethylene vinyl acetate. Alternatively thin film solar cells can be applied from various semiconductor materials, such as CIGS (copper-indium-gallium-selenide), CTS (cadmium-tellurium-sulfide), a-Si (amorphous silicon) and others on a carrier sheet which is also jacketed on both sides with encapsulant materials. Adhered to the encapsulant is a backsheet. Fluoropolymer coated films are useful for such backsheets. The fluoropolymer coating comprises fluoropolymer selected from homopolymers and copolymers of vinyl fluoride and homopolymers and copolymers of vinylidene fluoride polymer blended with compatible cross-linkable adhesive polymer containing functional groups selected from carboxylic acid, sulfonic acid, aziridine, anhydride, amine, isocyanate, melamine, epoxy, hydroxyl, and combinations thereof. The polymeric substrate film comprises functional groups on its surface that interact with the compatible cross-linkable adhesive polymer to promote bonding of the fluoropolymer coating to the substrate film. In one embodiment, the polymeric substrate film is a polyester, and in a more specific embodiment, a polyester selected from the group consisting of polyethylene terephthalate, polyethylene naphthalate and a coextrudate of polyethylene terephthalate/polyethylene naphthalate. Polyester provides electrical insulation and moisture barrier properties, and is an economical component of the backsheet. In some embodiments, both surfaces of the polymeric substrate film are coated with fluoropolymer creating a sandwich of polyester between two layers of coating of fluoropolymer. Fluoropolymer films provide excellent strength, weather resistance, UV resistance, and moisture barrier properties to the backsheet.

EXAMPLES

The concepts described herein will be further described in the following examples, which do not limit the scope of the invention described in the claims.

Test Methods

180 Degree Peel Strength

Peel strengths are measured using a Model 4201 Instron at 2"/min, recording the peak value and averaging 3 samples (ASTM D1876-01 T-Peel Test). If samples easily peeled by hand during the peel initiation step, a value of 0 was recorded.

Humidity Cabinet Peel Test

After removal from the humidity cabinet the samples are scored with a razor knife and a straight edge to produce ¼" wide strips. The 1" overhang is used as a handle and this tab is pulled at roughly a 180 degree angle with slow even tension until either the film breaks or a peel results. Film breaks and peels at either the EVA/glass or EVA/fluoropolymer coating interfaces are considered passing results. Peels between the fluoropolymer coating and the PET substrate are considered failures.

Cross-Hatch Adhesion

After removal from the humidity cabinet, the samples are scored with a razor knife, aided by a stainless steel template, to make 11 parallel cuts, about 3/32 inch (2.4 mm) apart, through the film to the glass surface. This procedure is repeated at right angles to the first cuts to produce a grid of 100 squares. A strip of transparent tape (3M Brand No. 467 PSA tape), 0.75 by 2.16 inch (1.9 by 5.5 cm), is pressed firmly over the scribed area with the tape oriented in a parallel direction to the scribed lines. The tape is then pulled off at a 90° angle rapidly but without jerking. Any failure between the fluoropolymer coating and the PET substrate is considered a failure.

Polyester Urethane/PVF Blend Compositions

Example 1

Example 1 demonstrates the adhesion of fluoropolymer coatings to unmodified polymeric substrate films. A variety of polyester diols and triols (Desmophen®, Bayer MaterialScience) cross-linked into PVF based fluoropolymer coatings using the isocyanurate trimer of hexamethylenediisocyanate (Desmodur® N-3300, Bayer MaterialScience) show adhesion to unmodified PET. The polyesters shown in Table 1 are representative.

TABLE 1

Polyester Diols and Triols.

| Desmophen® polyester | Diol-1 | diol-2 | triol | Acid | equivalent wt | MP | MW |
|---|---|---|---|---|---|---|---|
| F-2060B | EG | BD | TMP | AA | 660 | 30 | |
| S-1028-55 | HD | | | PA | 1020 | 20 | 2000 |
| F-2035 | HD | | TMP | AA | 216 | 35 | 650 |
| S-1040P-55 | EG | BD | | AA | 1020 | 30 | 2000 |
| S-101P-55 | EG | | | AA | 1020 | 60 | 2000 |
| S-101P-110 | EG | | | AA | 510 | 60 | 1000 |
| S-105-55 | HD | | | AA | 1020 | 60 | 2000 |
| S-107-55 | NPG | | | AA | 1020 | 25 | 2000 |
| S-108-46 | PG | | | AA | 1220 | 10 | |

EG = ethylene glycol
BD = 1,4-butanediol
HD = 1,6-hexanediol
NPG = neopentyl glycol
PG = propylene glycol
TMP = trimethylolpropane
AA = adipic acid
PA = phthalic acid Procedure:
1. Each of the polyesters shown in Table 1 were combined with a 42% solids PVF dispersion in propylene carbonate (30 parts polyester per 100 parts PVF using 50% solids solutions of the polyesters in propylene carbonate), an equivalent of Desmodur® N-3300 (polyisocyanate cross-linking agent) relative to polyester hydroxyl content and 0.02 parts dibutyltin dilaurate per 100 parts PVF.
2. The resulting mixtures were shaken on a paint shaker for 15 minutes.
3. The mixtures were drawn down on an unmodified 3 mil Melinex® 442 PET film (DuPont Teijin Films) using a 12 mil draw down knife.
4. A heavy bead of pure PVF dispersion was applied along one edge of the wet test film to produce an aid in initiating peeling after baking.
5. The coated films were baked in a 220° C. oven for 5 minutes using frames to hold the film.
6. After cooling, the pure PVF bead was used to initiate peeling, the samples were cut into 1 inch wide strips and instrumented peel strengths were measured.

Resulting peel strengths are shown in Table 2.

TABLE 2

Adhesion Results on Unmodified PET.

| Sample | Desmophen® polyester | avg peel (KG/inch) |
|---|---|---|
| 1 | F-2060B | 1.2 |
| 2 | S-1028-55 | 0.4 |
| 3 | F-2035 | 0.8 |
| 4 | S-1040P-55 | 1.4 |
| 5 | S-101P-55 | 1.5 |
| 6 | S-101P-110 | 1.0 |
| 7 | S-105-55 | 0.9 |
| 8 | S-107-55 | 1.5 |
| 9 | S-108-46 | 1.6 |

Example 2

Example 2 demonstrates the effects of compatible cross-linked adhesive polymer composition on the adhesion strength of fluoropolymer coatings on unmodified polymeric substrate films. Some compatible cross-linked adhesive polymers function better than others and can promote adhesion at much lower concentration. Table 3 shows results for Desmophen® F-2060B and S-101P-55 polyesters varied between 10 and 30 parts polyester per 100 parts PVF. Table 4 shows results for Desmophen® F-2060B from 1 to 10 parts polyester per 100 parts PVF. Samples 10 to 25 were each made using a heavier PET web, 5 mil Mylar® A (DuPont Teijin Films).

TABLE 3

Adhesion Sensitivity to Polyester Type and Concentration.

| Sample | Desmophen® polyester | PPH polyester on PVF | avg peel (KG/in) |
|---|---|---|---|
| 10 | F-2060B | 10 | 3.7 |
| 11 | F-2060B | 15 | 3.5 |
| 12 | F-2060B | 20 | 2.3 |
| 13 | F-2060B | 25 | 2.8 |
| 14 | F-2060B | 30 | 2.8 |
| 15 | S-101P-55 | 10 | 0.7 |
| 16 | S-101P-55 | 15 | 1.4 |
| 17 | S-101P-55 | 20 | 1.0 |
| 18 | S-101P-55 | 25 | 1.9 |
| 19 | S-101P-55 | 30 | 2.5 |

TABLE 4

Adhesion Results for Low Concentration Desmophen® F-2060B Polyester Formulations.

| Sample | Desmophen® polyester | PPH polyester on PVF | avg peel (KG/in) |
|---|---|---|---|
| 20 | F-2060B | 1 | 0.3 |
| 21 | F-2060B | 2 | 3.9 |
| 22 | F-2060B | 3 | 3.6 |
| 23 | F-2060B | 4 | 3.7 |
| 24 | F-2060B | 5 | 3.8 |
| 25 | F-2060B | 10 | 1.7 |

Example 3

Example 3 demonstrates the effects of cross-linking agent composition on the adhesion strength of fluoropolymer coatings on unmodified polymeric substrate films. Table 5 shows adhesion results for a variety of polyesters as a function of the amount of Desmodur® N-3300 cross-linking agent used. Best results are obtained with an equivalent or excess of cross-linking agent.

TABLE 5

Adhesion as a Function of Cross-linking agent Concentration.

| Sample | Desmophen® polyester (30 PPH on PVF) | Mole % Cross-linking agent | avg peel (KG/in) |
|---|---|---|---|
| 26 | F-2060B | 75 | 0.3 |
| 27 | F-2060B | 100 | 2.0 |
| 28 | F-2060B | 125 | 2.1 |
| 29 | F-2060B | 150 | 2.2 |
| 30 | S-1028-55 | 75 | 0.2 |
| 31 | S-1028-55 | 100 | 0.3 |
| 32 | S-1028-55 | 125 | 0.6 |
| 33 | S-1028-55 | 150 | 0.7 |
| 34 | F-2035 | 75 | 0.5 |
| 35 | F-2035 | 100 | 1.3 |
| 36 | F-2035 | 125 | 2.2 |
| 37 | F-2035 | 150 | 1.6 |
| 38 | S-101P-55 | 75 | 0.2 |
| 39 | S-101P-55 | 100 | 2.6 |

TABLE 5-continued

Adhesion as a Function of Cross-linking agent Concentration.

| Sample | Desmophen ® polyester (30 PPH on PVF) | Mole % Cross-linking agent | avg peel (KG/in) |
|---|---|---|---|
| 40 | S-101P-55 | 125 | 2.2 |
| 41 | S-101P-55 | 150 | 2.1 |
| 42 | S-105-55 | 75 | 0.2 |
| 43 | S-105-55 | 100 | 2.0 |
| 44 | S-105-55 | 125 | 2.4 |
| 45 | S-105-55 | 150 | 2.3 |

Example 4

Example 4 further demonstrates the effects of cross-linking agent composition on the adhesion strength of fluoropolymer coatings on unmodified polymeric substrate films. In addition, this examples demonstrates the effects of pigment on the adhesion strength of fluoropolymer coatings on polymeric substrate films. Table 6 shows a comparison of adhesion results for the polyester Desmophen® F-2060B crosslinked with either the HMDI isocyanurate trimer (Desmodur® N-3300) or the HMDI biuret trimer (Desmodur® N-75). Results show Desmodur® N-75 to be effective at promoting adhesion in this system as well. Samples 46 to 55 used the procedure described in Example 1 above on 3 mil Melinex® 442 webs, but in addition contained 45 parts white pigment per 100 parts PVF.

TABLE 6

Alternative Cross-linking agent.

| Sample | Desmophen ® polyester (30 PPH on PVF) | Desmodur ® Cross-linking agent | Mole % Cross-linking agent | avg peel (KG/in) |
|---|---|---|---|---|
| 46 | F-2060B | N 3300 | 75 | 0.1 |
| 47 | F-2060B | N 3300 | 100 | 1.2 |
| 48 | F-2060B | N 3300 | 125 | 1.8 |
| 49 | F-2060B | N 3300 | 150 | 1.6 |
| 50 | F-2060B | N 3300 | 200 | 1.4 |
| 51 | F-2060B | N 75 | 75 | 0.1 |
| 52 | F-2060B | N 75 | 100 | 0.7 |
| 53 | F-2060B | N 75 | 125 | 1.1 |
| 54 | F-2060B | N 75 | 150 | 0.9 |
| 55 | F-2060B | N 75 | 200 | 0.4 |

Polycarbonate Urethane/PVF Blend Compositions

Example 5

Example 5 further demonstrates the adhesion of fluoropolymer coatings to unmodified polymeric substrate films as a function of the composition of the compatible cross-linked adhesive polymer in the fluoropolymer coating. Table 7 shows adhesion results for polycarbonate urethane networks in a PVF matrix when formed on an unmodified PET surface. The polycarbonate urethane is derived from a polycarbonate diol, Desmophen® C-2200 (Bayer MaterialScience), reacted with Desmodur® N-3300 isocyanate functional cross-linking agent. The procedures used are the same as those described above for the polyester urethanes. All samples utilized an equivalent of the isocyanate cross-linking agent relative to the polycarbonate diol and utilized 0.02 parts dibutyltin dilaurate per 100 parts of PVF. Desmophen® C-2200 is a 2000 MW polycarbonate formally derived from 1,6-hexane diol plus carbonic acid. The results show strong adhesion at low concentration of polycarbonate urethane in the absence of pigment.

TABLE 7

Adhesion with Polycarbonate Urethane Blend Formulations.

| Sample | PPH polycarbonate diol on PVF | Mole % Desmodur ® N-3300 on polycarbonate diol | avg peel (KG/in) |
|---|---|---|---|
| 56 | 0.5 | 100 | 3.7 |
| 57 | 1 | 100 | 3.8 |
| 58 | 2 | 100 | 3.2 |

Example 6

Table 8 shows adhesion results for the addition of white pigment to a polycarbonate urethane blend formulation as in Example 5 at 1 part polycarbonate per 100 parts PVF and an equivalent of cross-linking agent relative to polycarbonate diol. Results clearly show that pigment can disrupt the formation of an adhesive bond with this formulation.

TABLE 8

Adhesion Results with White Pigment.

| Sample | Desmophen ® C-2200 on PVF (PPH) | Mole % Cross-linking agent on Desmophen ® C-2200 | White Pigment on PVF (PPH) | avg peel (KG/in) |
|---|---|---|---|---|
| 59 | 1 | 100 | 0 | 4.8 |
| 60 | 1 | 100 | 10 | 0.0 |
| 61 | 1 | 100 | 20 | 0.0 |
| 62 | 1 | 100 | 30 | 0.0 |

Example 7

Table 9 shows adhesion results for formulations of the type described in Examples 5 and 6 but that allow for the presence of pigment. Increasing the amount of polycarbonate diol in combination with greater than an equivalent of isocyanate functional cross-linking agent produces formulations that will tolerate pigment and still provide strong adhesive bonds between the polycarbonate urethane/PVF blend and an unmodified PET web. At 10 parts polycarbonate diol and 30 parts white pigment, the best bonds are achieved in the range of 150 to 200 mole % cross-linking agent relative to the polycarbonate diol.

TABLE 9

Adhesion Results with Pigment.

| Sample | PPH polycarbonate on PVF | Mole % Desmodur ® N-3300 on Desmophen ® C 2200 | Pigment on PVF | avg peel (KG/in) |
|---|---|---|---|---|
| 63 | 10 | 100 | 30 | 0.2 |
| 64 | 10 | 200 | 30 | 2.3 |
| 65 | 10 | 400 | 30 | 0.2 |
| 66 | 10 | 150 | 30 | 3.2 |
| 67 | 10 | 200 | 30 | 2.7 |
| 68 | 10 | 250 | 30 | 1.9 |
| 69 | 10 | 300 | 30 | 1.1 |

Example 8

Example 8 demonstrates the coating process under commercially practical conditions. In addition, this example shows the importance of adequate heat to produce durable bonds that will survive the abusive heat and humidity conditions common to photovoltaic backsheet testing. All of these samples have 10 parts polycarbonate diol (Desmophen® C-2200) relative to PVF in combination with either 150 or 200 mole % polyisocyanate cross-linking agent (Desmodur® N-3300). In addition, each utilized 0.02 parts dibutyltin dilaurate catalyst and 30 parts white pigment per 100 parts PVF. The coating mixtures were applied to an unmodified 3 mil PET web (Melinex® 377) using a reverse gravure process and then baked in a 3 zone floatation oven. The oven zones, each 5 feet long, were adjusted to 300° F./350° F./430° F. prior to coating. Line speeds were varied from 5 to 30 feet per minute.

The resulting coatings were then corona treated on the exterior surface using a hand held spark treater for bonding to EVA. Simulated photovoltaic modules were formed by vacuum lamination to glass panels using an EVA encapsulating resin 15295P/UF (Specialized Technology Resources, Inc.) common to the photovoltaic industry (10 minutes vacuum +5 minutes pressure at 150 C). The resulting panels had the following construction:

3 mil PET/1 mil coating/26 mils EVA/125 mils glass panel.

Samples made in this way were then subjected to 85° C./85% humidity exposure for 6 weeks. Peel and crosshatch testing were performed at 0, 2, 4 and 6 weeks exposure. Bonds between the coatings and the EVA were too strong to be peeled by hand. Hemostats were clamped onto the tabs and then twisted to force peeling. Results are shown for the peel testing in Table 10 and for the crosshatch testing in Table 11.

TABLE 10

Peel Testing After Humidity Cabinet Exposure.

| Sample | Mole % Cross-linking agent | Line Speed (ft/min) | Time 0 | 2 weeks | 4 weeks | 6 weeks |
|---|---|---|---|---|---|---|
| 70 | 150 | 30 | fail | fail | fail | fail |
| 71 | 150 | 10 | pass | pass | pass | fail |
| 72 | 150 | 5 | pass | pass | pass | pass |
| 73 | 200 | 30 | fail | fail | fail | fail |
| 74 | 200 | 10 | pass | pass | pass | fail |
| 75 | 200 | 5 | pass | pass | fail | pass |

TABLE 11

Crosshatch Testing After Humidity Cabinet Exposure.

| Sample | Mole % Cross-linking agent | Line Speed (ft/min) | Time 0 | 2 weeks | 4 weeks | 6 weeks |
|---|---|---|---|---|---|---|
| 70 | 150 | 30 | fail | fail | fail | fail |
| 71 | 150 | 10 | pass | pass | pass | pass |
| 72 | 150 | 5 | pass | pass | pass | pass |
| 73 | 200 | 30 | fail | fail | fail | fail |
| 74 | 200 | 10 | pass | pass | pass | pass |
| 75 | 200 | 5 | pass | pass | pass | pass |

Note that not all of the activities described above in the general description or the examples are required, that a portion of a specific activity may not be required, and one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof has been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all of the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any sub-combination. Further, reference to values stated in ranges include each and every value within that range.

What is claimed is:

1. A fluoropolymer coated film comprising:
a polymeric substrate film; and
a fluoropolymer coating directly on the polymeric substrate film, the fluoropolymer coating comprising:
a fluoropolymer selected from the group consisting of homopolymers and copolymers of vinyl fluoride and homopolymers and copolymers of vinylidene fluoride; and
a compatible cross-linked adhesive polymer comprising functional groups selected from the group consisting of carboxylic acid, sulfonic acid, aziridine, anhydride, amine, isocyanate, melamine, epoxy, hydroxyl, and combinations thereof, wherein the compatible cross-linked adhesive polymer is selected from the group consisting of polyesters, polyester urethanes, polycarbonates, polycarbonate urethanes, acrylics, acrylic polyurethanes, polyethers, polyether urethanes, ethylene vinyl alcohol copolymers, ethylene vinyl alcohol copolymer urethanes, polyamides, polyamide urethanes, polyamide ureas, polyacrylamides, polyacrylamide urethanes and combinations thereof, wherein the fluoropolymer coating comprises interpenetrating networks of fluoropolymer and compatible cross-linked adhesive polymer and the compatible cross-linked adhesive polymer has pendant functionality capable of reacting with complementary functional groups on the substrate film surface;
wherein the polymeric substrate film comprises functional groups that interact with the compatible cross-linked adhesive polymer to promote bonding of the fluoropolymer coating to the polymeric substrate film.

2. The fluoropolymer coated film of claim 1, wherein the fluoropolymer is selected from the group consisting of homopolymers and copolymers of vinyl fluoride comprising at least 60 mole % vinyl fluoride and homopolymers and copolymers of vinylidene fluoride comprising at least 60 mole % vinylidene fluoride.

3. The fluoropolymer coated film of claim 1, wherein the fluoropolymer coating comprises about 1 to about 40 weight % of the compatible cross-linked adhesive polymer based on fluoropolymer solids content.

4. The fluoropolymer coated film of claim 1, wherein the fluoropolymer coating is on both sides of the polymeric substrate film.

5. The fluoropolymer coated film of claim 1, wherein said polymeric substrate film is unmodified polymeric substrate film.

6. The fluoropolymer coated film of claim 1, wherein the fluoropolymer coating has a thickness of about 0.1 to about 10.0 mils.

7. The fluoropolymer coated film of claim 1, wherein the polymeric substrate film has a thickness of about 0.5 to about 10 mils.

8. The fluoropolymer coated film of claim 1, wherein the polymeric substrate film further comprises filler.

9. A backsheet for a photovoltaic module comprising the fluoropolymer coated film of claim 1.

10. The fluoropolymer coated film of claim 1, wherein the fluoropolymer coating further comprises pigment.

11. The fluoropolymer coated film of claim 10, wherein the fluoropolymer coating comprises about 1 to about 35 weight % of pigment based on fluoropolymer solids content.

12. The fluoropolymer coated film of claim 1, wherein the polymeric substrate film comprises polyester, polyamide, polyimide, or any combination thereof.

13. The fluoropolymer coated film of claim 12, wherein the polymeric substrate film comprises polyester selected from the group consisting of polyethylene terephthalate, polyethylene naphthalate, and combinations thereof.

* * * * *